United States Patent
Mayer et al.

(10) Patent No.: US 10,955,384 B2
(45) Date of Patent: Mar. 23, 2021

(54) ARRANGEMENT AND METHOD FOR INFLUENCING AND/OR DETECTING A DYNAMIC OR STATIC PROPERTY OF A SUPPORT STRUCTURE

(71) Applicant: FRAUNHOFER-GESELLSCHAFT ZUR FORDERUNG DER ANGEWANDTEN FORSCHUNG E.V., Munich (DE)

(72) Inventors: Dirk Mayer, Darmstadt (DE); Rogério Salloum, Darmstadt (DE)

(73) Assignee: FRAUNHOFER-GESELLSCHAFT ZUR FORDERUNG DER ANGEWANDTEN FORSCHUNG E.V., Munich (DE)

( * ) Notice: Subject to any disclaimer, the term of this patent is extended or adjusted under 35 U.S.C. 154(b) by 350 days.

(21) Appl. No.: 15/757,648

(22) PCT Filed: Aug. 29, 2016

(86) PCT No.: PCT/EP2016/070299
§ 371 (c)(1),
(2) Date: Mar. 5, 2018

(87) PCT Pub. No.: WO2017/037007
PCT Pub. Date: Mar. 9, 2017

(65) Prior Publication Data
US 2018/0246067 A1    Aug. 30, 2018

(30) Foreign Application Priority Data

Sep. 3, 2015  (DE) .................. 10 2015 216 846.8

(51) Int. Cl.
*G01N 29/22* (2006.01)
*H01L 41/08* (2006.01)
(Continued)

(52) U.S. Cl.
CPC ............ *G01N 29/223* (2013.01); *B32B 3/08* (2013.01); *B32B 3/266* (2013.01); *B32B 5/024* (2013.01);
(Continued)

(58) Field of Classification Search
CPC .. G01N 29/223; G01N 29/04; G01N 29/2437; G01N 1/00; B32B 3/08;
(Continued)

(56) References Cited

U.S. PATENT DOCUMENTS

| | | | | |
|---|---|---|---|---|
| 5,552,656 A | * | 9/1996 | Taylor | ............ B63B 59/04 310/317 |
| 6,014,896 A | * | 1/2000 | Schoess | ............ G01H 1/003 73/583 |

(Continued)

*Primary Examiner* — Lisa M Caputo
*Assistant Examiner* — Rose M Miller
(74) *Attorney, Agent, or Firm* — Fitch, Even, Tabin & Flannery, LLP

(57) ABSTRACT

An arrangement and a method are described for influencing and/or detecting a dynamic or static property of a support structure which has a support structure surface, with at least one planar first actuator element that includes at least one electrically and/or magnetically activated transducer material, and a fiber composite material which joins the first actuator element indirectly or directly to the support structure surface in a planar, which has at least one first fiber layer and a curable matrix. The first fiber layer at least partially covers the first actuator element resting indirectly or directly on the support structure surface, protrudes beyond the first actuator element on both sides along at least a spatial direction running parallel to the support structure surface, and permanently adheres directly to at least some areas of the support structure surface at least in the regions protruding beyond the first actuator element by means of the curable matrix.

21 Claims, 1 Drawing Sheet

(51) Int. Cl.
    *H01L 41/23*     (2013.01)
    *G01N 29/24*     (2006.01)
    *H01L 41/053*     (2006.01)
    *B32B 5/26*     (2006.01)
    *B32B 3/26*     (2006.01)
    *B32B 3/08*     (2006.01)
    *B32B 7/12*     (2006.01)
    *B32B 5/02*     (2006.01)
    *B32B 5/12*     (2006.01)
    *G01N 29/04*     (2006.01)
    *H01L 41/09*     (2006.01)
    *G01N 1/00*     (2006.01)

(52) U.S. Cl.
    CPC .................. *B32B 5/12* (2013.01); *B32B 5/26* (2013.01); *B32B 7/12* (2013.01); *G01N 1/00* (2013.01); *G01N 29/04* (2013.01); *G01N 29/2437* (2013.01); *H01L 41/053* (2013.01); *H01L 41/0533* (2013.01); *H01L 41/08* (2013.01); *H01L 41/09* (2013.01); *H01L 41/23* (2013.01); *B32B 2250/20* (2013.01); *B32B 2260/023* (2013.01); *B32B 2260/046* (2013.01); *B32B 2262/02* (2013.01); *B32B 2262/101* (2013.01); *B32B 2262/106* (2013.01); *B32B 2307/20* (2013.01); *B32B 2307/202* (2013.01); *B32B 2307/206* (2013.01); *B32B 2419/00* (2013.01); *B32B 2605/08* (2013.01); *B32B 2605/18* (2013.01)

(58) Field of Classification Search
    CPC ........... B32B 3/266; B32B 5/024; B32B 5/12; B32B 5/26; B32B 7/12; B32B 2250/20; B32B 2260/20; B32B 2260/046; B32B 2262/02; B32B 2262/101; B32B 2262/106; B32B 2307/20; B32B 2307/202; B32B 2307/206; B32B 2419/00; B32B 2605/08; B32B 2605/18; H01L 41/053; H01L 41/0533; H01L 41/08; H01L 41/09; H01L 41/23
    USPC ......................................................... 73/649
    See application file for complete search history.

(56) References Cited

U.S. PATENT DOCUMENTS

2011/0077517 A1*   3/2011   Satou .................. A61B 8/4477
                                                                                  600/443
2011/0213271 A1*   9/2011   Telfort ................. A61B 7/008
                                                                                  600/586

* cited by examiner

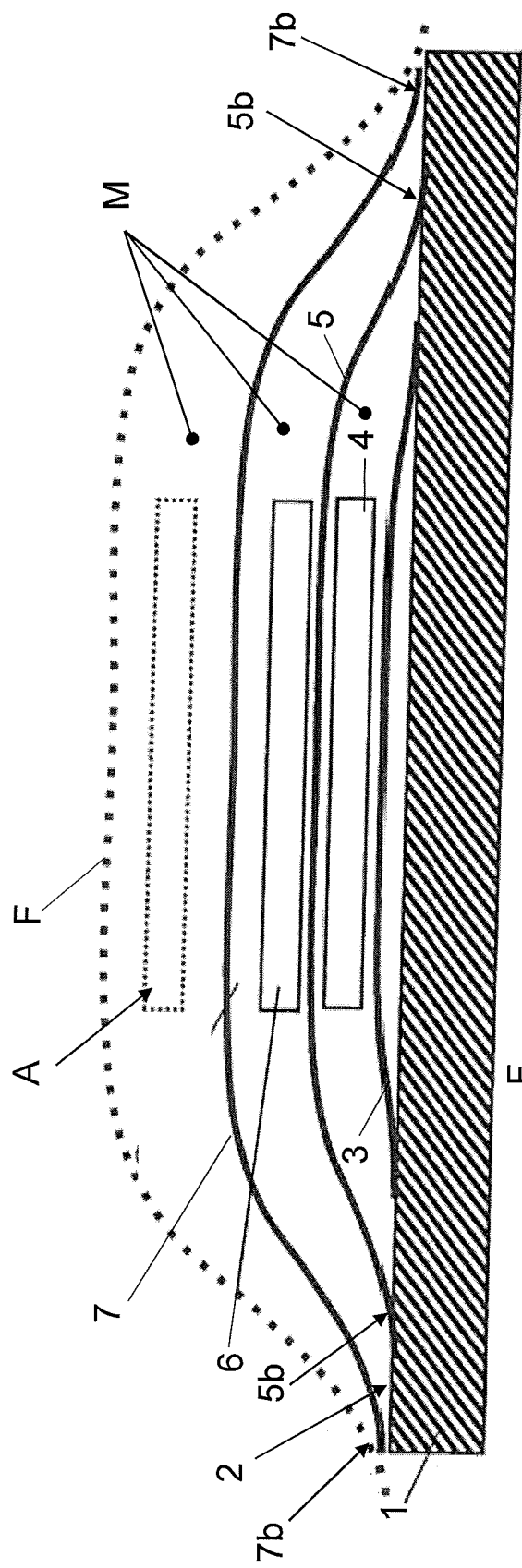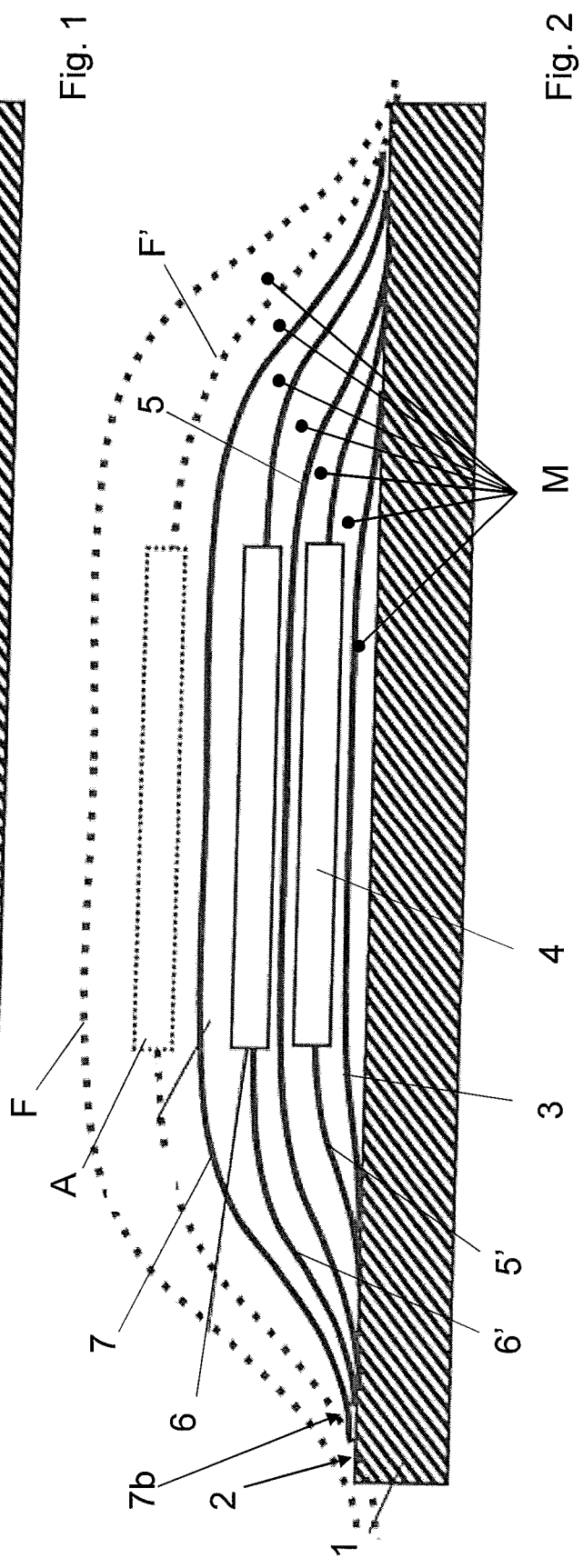

ARRANGEMENT AND METHOD FOR INFLUENCING AND/OR DETECTING A DYNAMIC OR STATIC PROPERTY OF A SUPPORT STRUCTURE

CROSS REFERENCE TO RELATED APPLICATIONS

Reference is made to International Application No. PCT/EP2016/070299 filed Aug. 29, 2016, and German Application No. 10 2015 216 846.8 filed Sep. 3, 2015, which are incorporated herein by reference in their entirety.

BACKGROUND OF THE INVENTION

Field of the Invention

The invention relates to an arrangement and a method for at least one of influencing and detecting a dynamic or static property of a support structure which has a support structure surface with at least one planar first actuator element that includes at least one of an electrically and magnetically activated transducer material which comprises a fiber composite material joining the first actuator element in a indirectly or directly to the support structure surface, which has at least one first fiber layer and a curable matrix.

Related Art

Species-related arrangements of the type described above are used for example to exercise controlled influence over the movement or vibration behavior of any part or any group of parts or components from the fields of mechanical or apparatus engineering. For purposes of targeted influence on the dynamic behavior of a part, use is made of the transformational properties inherent in the transducer material which enable a conversion of at least one of electrical and magnetic signals into geometrical changes and associated therewith into mechanically effective and usable positioning changes, and back again, in the case of piezoelectric, electrostrictive or magnetostrictive materials. These transducers, which in the following text are referred to simply as actuator elements, are permanently attached to the respective part, thus creating the most direct force coupling possible between the actuator element and the surface of the part, which is referred to as the support structure surface hereinafter.

Of the many suitable electric and also magnetic transducer materials, actuator elements containing or made from piezoelectric material are widely used both for actuator-related and sensor-related tasks. Actuator elements of such kind, also called "piezoactuators", are planar or wafer-like elements made of piezoelectric material which change their spatial shape when an electrical voltage is applied, and as part of a permanent bonded joint with the support structure are thus able to introduce forces into it. Actuator elements of such kind, which are structurally integrated or applied similarly, are also suitable for detecting damage, for example, through analysis of the interaction between elastic waves coupled into the support structure and structural damage present in the support structure. In the latter case, the actuator element also functions as a sensor element by generating electrical signals that are able to impinge on the piezoelectric material in the form of an external deformation acting thereon for vibration analysis.

Depending on the shape, size and weight of the support structure on which dynamic influence is to be exerted, and depending on the intended dynamic effect on the support structure to be achieved with the aid of the actuator element applied thereto, a corresponding number of actuator elements also of corresponding size are permanently attached locally to the surface of a support structure in order to generate bending moments by which the support structure is elastically deformed in controlled manner.

An electromechanical functional module is disclosed in DE 100 51 784 C1, which includes a multiplicity of laminated fiber layers, and having disc-like piezoelectric actuator elements constructed one on top of the other and embedded in vertical sequence between and within the individual fiber layers. The electromechanical functional module has a top and a bottom fiber cover layer, via which the entire functional module may be permanently joined to a surface of a support structure. The disadvantage of such enclosed functional modules is that a relatively thick module does not provide good force coupling with the support structure, particularly in the upper actuator elements in the stack sequence.

As an alternative to applying them to the support structure surface, individual actuator elements may also be integrated in the support structure, to improve the force coupling and also to improve the protection of individual actuator elements against external mechanical as well as atmospheric influences. The integration of individual or multiple actuator elements in a support structure is practical mainly in cases in which the support structure is made of a fiber composite material, so the actuator elements can easily be integrated in the inter-fiber layers of the composite structures. But this assumes that the application takes place while the support structure is being manufactured. If they are damaged, however, the actuators integrated in the support structure cannot be replaced, or at least this involves a great deal of work. Added to this is the problem of recyclability of the support structure, since piezoelectric materials often contain toxic components, that is lead.

Document DE 101 39 686 B4 discloses a piezoelectric extension actuator for reducing vibration in structures, which includes a piezo stack in the form of a column and having a multiplicity of individual piezo elements, in which the longitudinal direction of the stack is orientated parallel to the structure surface. In order to attach the extension actuator to the structure surface in a force coupling manner, angular output elements are provided on the front faces of each of the opposite ends of the piezo stack and are fastened to the surface of the structure. Although the known extension actuator is able to introduce strong forces and bending moments into the structure, the mechanical coupling demands a relatively large number of single parts, which in turn impede the introduction of force and also increase the susceptibility of the actuator arrangement to possible incorrect loads.

Document DE 10 2010 051 261 A1 presents a method for creating 3-dimensional drapable thermosetting semi-finished functional elements for integration in fiber-thermoset composites, in which a functional element is placed on or in an incompletely crosslinked resin bed and fixed flat by the inherent stickiness of the resin bed. The surface of the resin bed together with the functional element positioned thereon is then cast in resin, so that after solidifying and complete crosslinking of the resin matrix a functional element completely encapsulated in resin is obtained.

Document DE 10 2006 043 015 A1 describes a method for producing a film module which contains a direct composite between a functional material and a polymer carrier, which is obtained in an injection molding process. The application of the film module to a carrier is carried out conventionally by means of an adhesive and/or force and/or form-fit joint.

Document EP 1 324 402 A1 discloses an electroactive device with a piezoelectric layer which is in a planar composite with a prestress layer, via which the piezoelectric layer is compressed. The prestress layer has an adhesive layer which contains a reinforcing material. The electroactive may be joined to a surface of a structure in a vacuum process by use of a high temperature layer material.

SUMMARY OF THE INVENTION

The objective underlying the invention is to further develop an arrangement and a method for at least one of influencing and/or detecting a dynamic or static property of a support structure which has a support structure surface, with at least one planar first actuator element, which has at least one transducer material that can be activated at least by one of electrically and magnetically, and a fiber composite material which joins the first actuator element in planar manner indirectly or directly to the support structure surface, with at least one first fiber layer and a curable matrix, in such manner that the mechanical coupling between the at least one actuator element and the support structure surface and associated therewith the transfer of force and bending moments between the at least one actuator element and the support structure surface is improved. This should also apply particularly for those actuator elements which are at a greater distance from the support structure surface than the first actuator element, which rests directly or indirectly flat against the support structure surface due to a multiplicity of actuator elements arranged one on top of the other with fiber layers interposed between each element in the form of a stack arrangement.

The invention is presented in the further description with reference to the figures of the drawings.

According to the invention, an arrangement for at least one of influencing and/or detecting a dynamic or static property of a structure is characterized in that the first fiber layer at least partly covers the first actuator element resting indirectly or directly on the support structure surface. The partial coverage by the first fiber layer is characterized in that the first fiber layer protrudes beyond the first actuator element on both sides along at least one spatial direction running parallel to the support structure surface and at least in the areas of the fiber layer protruding beyond the first actuator element adheres at least in regions permanently directly attached to the support structure surface by use of the curable matrix. In this way, it is ensured that the forces generated by deformation, whether by deformation of the support structure surface or of the actuator element, can be transferred along the fiber layer directly between the actuator element and the support structure, since the fiber layer is permanently joined to both the planar actuator element and the support structure surface via the matrix, which preferably is a curable resin material.

In the simplest embodiment thereof, the term "fiber layer" comprises at least one fiber bundle extending unidirectionally or a unidirectional scrim having individual fibers which is suitable for bidirectional transfer of forces along the individual fibers. The length of the fibers is such that the fibers protrude beyond the at least one actuator element on both sides along the spatial direction orientated parallel to the support structure surface and permanently adhere to the support structure surface on both sides by use of the matrix. Unidirectional scrims of such kind are also called UD layers. The use of braided fibers in the form of fiber fabric mats or layers that are suitable for transferring forces along the lateral extent of the fiber layer are particularly preferred.

The term "planar actuator element" is understood to refer to a spatial shape of the actuator which is characterized by a flat surface, extending laterally, and by a thickness dimension orientated orthogonally to the lateral extent, wherein the thickness dimension is very considerably smaller than the lateral extent. Wafer-like or panel-like actuator elements for example represent synonymous formulations. The planar actuator elements do not necessarily have to be of flat construction. Thus, actuator elements that are curved or bent in planar manner are certainly conceivable, particularly in cases in which the support structure surface itself is spatially curved.

The first fiber layer, in the sense of a unidirectional fibre scrim or fiber layer, covers the planar actuator element resting indirectly or directly on the support structure surface at least in the manner of a bridge. The fiber layer is permanently joined to the support structure surface at two surface areas opposite the first actuator element. The lengthwise extension of the fiber layer protruding at least in the manner of a bridge is preferably orientated along the main deformation direction of the actuator element, so that the transformation properties of the transducer material in the actuator element may be used with as little loss as possible.

A preferred embodiment of the arrangement according to the invention provides the first fiber layer in the form of a fiber fabric layer completely covering the first actuator element resting indirectly or directly on the support structure surface and protruding beyond the actuator element over the entire peripheral border thereof, so that the first fiber layer adheres permanently to the support structure surface by use of the curable matrix and together with the support structure surface completely encloses the actuator element. In this way, all deformations and bending moments that occur may be transferred between the planar actuator element and the support structure surface via the fiber layer.

In a preferred further development of the arrangement according to the invention, a second layer sequence, comprising at least one second planar actuator element and one second fiber layer, preferably in the form of a fiber fabric layer, is directly or indirectly joined permanently in planar manner to the first fiber layer which at least partially covers the first actuator element. The second fiber layer at least partially covers the second actuator element and protrudes beyond the second actuator element and also beyond the first fiber layer on both at least along the at least one spatial direction orientated parallel to the support structure surface, and in these areas adheres permanently directly to the support structure surface by use of the curable matrix.

Forces and bending moments may be transferred directly between the second planar actuator element and the support structure surface via the second fiber layer, which like the first fiber layer rests directly on the support surface layer at least in the peripheral border areas thereof and is permanently connected thereto by use of the curable matrix.

In the same way, the arrangement according to the invention may be expanded by arranging any number of additional layer sequences on the previously described second fiber layer, one on top of the other in stacked manner, each one comprising at least one planar actuator element and one fiber layer. In this context, it is important to ensure that at least a part of the border area of each fiber layer assigned to the individual layer sequences rests directly on the support structure surface and adheres permanently thereto by use of the curable matrix.

Each individual fiber layer is designed such that direct contact with the support structure surface is established, thereby ensuring a direct transfer of force between the support structure surface and the actuator element associated with the respective layer sequence. This guarantees an effective transfer of force between the individual actuator elements and the support structure surface, particularly for the upper planar actuator elements in the stacked layer sequence, which are located farther from the support structure surface.

The individual fiber layers advantageously consist of an electrically non-conductive material, preferably glass fibers or synthetic fibers, thus ensuring electrical insulation between the individual, preferably piezoelectric actuator elements. However, the use of electrically conductive fiber materials, such as carbon fibers, is conceivable in cases in which it is not necessary to ensure the required electrical insulation by use of the fibers.

Other transducer materials besides the use of piezoelectric or piezoceramic material, such as magnetostrictive or electrostrictive materials or piezoelectric ceramics, are also conceivable for creating the at least one actuator element. The use of shape memory alloys is also conceivable.

In a further preferred embodiment, which provides for a multiplicity of actuator elements arranged one on top of the other with fiber layers interposed between each actuator element, the actuator elements are identical in shape and size and are arranged in alignment one above the other. The individual fiber layers arranged in the form of a fiber fabric layer also preferably have coordinated fiber orientations, which are preferably arranged with the same orientation as each other. The fiber orientations must be selected suitably with regard to the at least one of the actuator element and the dynamic behavior of the support structure, also particularly taking into account the main deformation direction.

Depending on the size of the support structure and the actuating forces that are to be applied by the actuator arrangement in order to create an effective deformation of the support structure, embodiments are conceivable in which two and more actuator elements are arranged side by side in each layer. In this case also, each individual fiber layer assigned to the actuator elements in each layer protrudes beyond all the actuator elements arranged in the layer and is able to transfer forces directly between the actuator elements and the support structure.

The structure and arrangement of the preferred multiple planar actuator elements arranged one on top of the other with the fiber layers assigned to each of them, which layers are each individually in direct contact with the support structure surface, is based on a method according to the invention, in which the forces and bending moments acting between the support structure surface and the individual actuator elements are each transferred directly along the fiber layers that are assigned to the actuator elements. With this direct manner of force transfer, it is possible to effectively influence the dynamic and also the static properties of the support structure making optimal use of the inherent transformation properties of the individual actuator elements. The optimal use is particularly effective in the case of those actuator elements that are arranged farthest from the support structure in the stack arrangement.

The arrangement according to the invention may be applied to practically all freely accessible support structure surfaces, to enable targeted vibration influence, which is a dynamic influence and influence on the size and geometry of a support structure which is static influence. Thus, based on its controllable and coordinated at least one of change of the geometry and length of all actuator elements in the stack arrangement, the arrangement according to the invention enables the geometry of the support structure to be changed actively. Such changes in length are extremely useful for example in order to compensate for thermally induced length changes or to change the geometry of aerodynamically functional planar parts.

The arrangement according to the invention also serves to detect damage in a support structure in which the individual actuator elements are each operated as sensors. The arrangement according to the invention may advantageously be applied to and used on structures in automotive manufacturing, aviation, mechanical engineering or architecture.

BRIEF DESCRIPTION OF THE DRAWINGS

In the following section, the invention will be described for exemplary purposes without limitation of the general inventive thought, based on embodiments thereof and with reference to the drawing. In the drawing:

FIG. 1 is a diagrammatic cross section through an arrangement constructed according to the invention with a multiplicity of planar actuator elements joined one on top of the other; and FIG. 2 is an alternative arrangement with a multiplicity of planar actuator elements joined one on top of the other, each inside a fiber fabric layer.

DETAILED DESCRIPTION OF THE INVENTION

FIG. 1 shows a cross-sectional representation through an arrangement constructed according to the invention for influencing the dynamic properties of a support structure 1, with a freely accessible support structure surface 2. A bottom fiber layer in the form of a fiber layer 3, preferably a glass fiber layer, is applied to support structure surface 2 for purposes of electrical insulation, on which a first planar actuator element 4 rests. Actuator element 4, which is preferably a piezoelectric element in a wafer form, has an upper side and a lower side which are orientated parallel to support structure surface 2. A first fiber fabric layer 5 is arranged over first actuator element and protrudes laterally, that is to the sides of the support structure surface 2, beyond both the first actuator element 4 and the fiber layer 3 directly below it. In this way, first fiber layer 5 has areas 5b which rest directly on support structure surface 2. By using a curable matrix M, preferably in the form of a curable resin, which surrounds at least the first actuator element 4 and penetrates at least the fiber layers 3 and 5, first fiber layer 5 adheres permanently and directly to support structure surface 2 in areas 5b.

Additionally, a second planar actuator element 6, which is preferably constructed identically to actuator element 4 in shape and size, is applied over first fiber fabric layer 5. A second fiber fabric layer 7 is arranged over the second actuator element 6, protruding laterally beyond both the second actuator element 6 and also the first fiber fabric layer 5, and having areas 7b which rest directly on support structure surface 2 and adhere permanently thereto by use of the curable matrix M.

A multiplicity of further layer sequences of such kind, each comprising an actuator element A and an associated fibre layer F, then follows, arranged in the same way one on top of the other in the manner of a stack over the second fiber fabric layer 7. This is illustrated in principle by the dotted lines relating respectively to actuator element A and fiber layer F.

All fiber layers F and actuator elements A are surrounded by a curable matrix M and penetrated thereby. Each individual fiber layer F, which is arranged directly above an actuator element A, enters into direct contact with support structure surface 2 via its peripheral border region, so that forces and also bending moments may be transferred directly in both directions between support structure surface 2 and the respective actuator element A. This lends to the layer-like arrangement of the property according to which particularly those actuator elements A which are located farthest from support structure surface 2 in the stack arrangement are in direct force-communicating connection with the support structure surface, so that the forces induced by deformations can be transferred between support structure surface 2 and actuator element A along the respective fiber layer F practically without loss.

A further variant of the arrangement according to the invention is represented in FIG. 2, in which, in addition to the first and second fiber layers 5, 7 and further fiber layers F described previously, additional inter-fiber layers 5', 6', F' are introduced into the stack arrangement, each of which is furnished with cutouts adapted to the individual actuator elements 4, 6, A, into which the actuator elements are inserted in close fitting manner, and seamlessly surround the peripheral border of each of them. The additional inter-fiber layers 5', 6', F' make it possible to further improve the transfer of forces between the actuator elements and the support structure surface compared with the embodiment represented in FIG. 1, since even inter-fiber layers 5', 6', F' are also connected permanently to support structure surface 2 by their peripheral border areas.

The arrangement according to the invention for directly influencing the dynamic properties of a support structure provides a multiplicity of advantages: Optimized mechanical coupling of all actuator elements with the support structure via at least one fiber layer assigned to the respective actuator elements, which is directly to the support structure by an adhesive and force-communicating joint.

The arrangement of all actuator elements on and thus above the support structure surface makes it possible to couple the arrangement according to the invention outside of the neutral fibers of the support structure for the purpose of effectively generating bending moments that act on the support structure.

All actuator elements integrated in the arrangement are protected against external environmental influences by the fiber composite material and by the matrix M.

Compared with an integral arrangement of actuator elements inside a support structure, the arrangement according to the invention is simpler and therefore less expensive to manufacture, since it constitutes only surface application. In principle, the arrangement according to the invention can be applied to all support structures, in particular also to metal support structure surfaces.

Replacement in the event of defective actuator elements can be carried out easily and inexpensively.

In contrast to an integral design, in which the piezoelectric materials typically contain toxic material such as lead, the arrangement according to the invention is recyclable.

Finally, the tolerance to damage of the arrangement according to the invention should be emphasized, since a malfunction of individual actuator elements does not result in failure of the entire arrangement.

REFERENCE LIST

1 Support structure
2 Support structure surface
3 Bottom fiber layer
4 First actuator element
5 First fiber fabric layer
5b Peripheral areas of the first fiber layer
5' Intermediate fiber fabric layer
6 Second planar actuator element
6' Intermediate fiber fabric layer
7 Second fiber fabric layer
7b Peripheral areas of the second fiber layer
M Matrix
A Further actuator elements
F Further fiber fabric layer

The invention claimed is:

1. An arrangement for at least one of influencing or detecting a dynamic or static property of a support structure having a support structure surface, with at least one planar first actuator, that includes at least one of an electrically or a magnetically activated transducer, and a fiber composite joining the at least one planar first actuator in a plane to the support structure surface, which has at least a first fiber layer and a curable matrix,
the first fiber layer
a) at least partially covers the at least one planar first actuator resting on the support structure surface;
b) protrudes beyond the at least one first actuator on both sides along at least a spatial direction running parallel to the support structure surface; and
c) the curable matrix permanently adhering to at least areas of the support structure surface at least in regions protruding beyond the first actuator; and wherein
the arrangement comprises:
a second layer, including at least one second actuator and a second fiber layer which is permanently joined in a plane to the first fiber layer covering the at least one planar first actuator; and wherein
the second fiber layer at least partially covers the at least one second actuator, protrudes on both sides thereof beyond both of the at least one second actuator and the first fiber layer at least in a spatial direction extending parallel to the support structure surface; and
the curable matrix at least in regions adheres permanently directly to the support structure surface in areas protruding beyond the at least one second actuator and the first fiber layer.

2. The arrangement according to claim 1, comprising:
additional layers each comprising at least an actuator and a fiber layer which are permanently joined in a plane to the second fiber layer and an area of each fiber layer of an additional layer adheres permanently to the support structure surface using the curable matrix.

3. The arrangement according to claim 2, wherein:
the first fiber layer covering the at least one planar first actuator provide a permanent, planar composite including the curable matrix bonded with the at least one first planar first actuator so that the at least one planar first actuator is directly connected with the support structure surface along the first fiber layer.

4. The arrangement according to claim 2, wherein the first fiber layer comprises a fiber scrim or fiber fabric layer.

5. The arrangement according to claim 2, wherein the at least one transducer of the at least one planar first actuator comprises at least one of a piezoelectric, a piezoceramic, magnetostrictive materials, electrostrictive ceramics, or a shape memory alloy.

6. The arrangement according to claim 2, wherein all actuators in the layers are identical in shape and size and are arranged in alignment for stacking one above the other.

7. The arrangement according to claim 1, wherein:
the first fiber layer covering the at least one first actuator provides a permanent, planar composite including the curable matrix bonded with the at least one planar first actuator is directly connected with the support structure surface along the first fiber layer.

8. The arrangement according to claim 7, wherein:
the fiber layer and the at least one planar actuator of each layer form a permanent, planar composite including the curable matrix bonded with the at least one planar actuator which is connected to the support structure surface along the fiber layer.

9. The arrangement according to claim 8, comprising:
the first fiber layer including a planar cutout conforming to shape to the planar first actuator which is defined by a peripheral border of the planar first actuator; and wherein
the planar first actuator is positioned in the cutout along the first fiber layer and regions of each first fiber layer adhere permanently to the support structure by using the curable matrix.

10. The arrangement according to claim 8, wherein
the first fiber layer comprises a fiber scrim or fiber fabric layer.

11. The arrangement according to claim 8, wherein the at least one transducer of the at least one planar first actuator comprises at least one of a piezoelectric, a piezoceramic, magnetostrictive materials, electrostrictive ceramics, or a shape memory alloy.

12. The arrangement according to claim 7, comprising:
the first fiber layer including a planar cutout conforming to shape to the planar first actuator which is defined by a peripheral border of the planar first actuator; and wherein
the planar first actuator is positioned in the cutout along the first fiber layer and regions of each first fiber layer adhere permanently to the support structure by using the curable matrix.

13. The arrangement according to claim 7, comprising:
the first fiber layer including a planar cutout conforming to shape to the planar first actuator which is defined by a peripheral border of the planar first actuator; and wherein
the planar first actuator is positioned in the cutout along the first fiber layer and regions of each first fiber layer adhere permanently to the support structure by using the curable matrix.

14. The arrangement according to claim 13, wherein
the first fiber layer comprises a fiber scrim or fiber fabric layer.

15. The arrangement according to claim 7, wherein
the first fiber layer comprises a fiber scrim or fiber fabric layer.

16. The arrangement according to claim 7, wherein the at least one transducer of the at least one planar first actuator comprises at least one of a piezoelectric, a piezoceramic, magnetostrictive materials, electrostrictive ceramics, or a shape memory alloy.

17. The arrangement according to claim 1, comprising:
the first fiber layer including a planar cutout conforming to shape to the planar first actuator which is defined by a peripheral border of the planar first actuator; and wherein
the planar first actuator is positioned in the cutout along the first fiber layer and regions of each first fiber layer adhere permanently to the support structure by using the curable matrix.

18. The arrangement according to claim 1, wherein
the first fiber layer comprises a fiber scrim or fiber fabric layer.

19. The arrangement according to claim 1, wherein the at least one transducer of the at least one planar first actuator comprises at least one of a piezoelectric, a piezoceramic, magnetostrictive materials, electrostrictive ceramics, or a shape memory alloy.

20. A method of use of the arrangement of claim 1, comprising:
influencing vibration of the support structure by actuating at least one of the actuators.

21. A method use according to claim 20, wherein support structure is in one of automotive manufacturing, aviation, mechanical engineering, or architecture.

* * * * *